(12) United States Patent
Bohlländer

(10) Patent No.: US 12,040,723 B2
(45) Date of Patent: Jul. 16, 2024

(54) MINIMALISTIC POWER CONVERTER AND VEHICLE INCLUDING A POWER CONVERTER

(71) Applicant: Rolls-Royce Deutschland Ltd & Co KG, Blankenfelde-Mahlow (DE)

(72) Inventor: Marco Bohlländer, Hirschaid (DE)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 332 days.

(21) Appl. No.: 17/604,845

(22) PCT Filed: May 5, 2020

(86) PCT No.: PCT/EP2020/062417
§ 371 (c)(1),
(2) Date: Oct. 19, 2021

(87) PCT Pub. No.: WO2020/229222
PCT Pub. Date: Nov. 19, 2020

(65) Prior Publication Data
US 2022/0201892 A1      Jun. 23, 2022

(30) Foreign Application Priority Data
May 13, 2019  (DE) ............. 10 2019 206 872.3

(51) Int. Cl.
*H02M 7/00*   (2006.01)
*H02M 1/14*   (2006.01)
*H05K 7/20*   (2006.01)

(52) U.S. Cl.
CPC ........... *H02M 7/003* (2013.01); *H02M 1/14* (2013.01); *H05K 7/209* (2013.01)

(58) Field of Classification Search
CPC ......... H02M 7/003; H02M 1/14; H05K 7/209
See application file for complete search history.

(56) References Cited

U.S. PATENT DOCUMENTS 10,084,310 B1   9/2018  Neely et al.
2004/0024937 A1*  2/2004  Duncan ............... H02M 7/003
                                                   710/100

(Continued)

FOREIGN PATENT DOCUMENTS

DE      10100620 A1    12/2001
DE    102015207117 A1    1/2016

(Continued)

OTHER PUBLICATIONS

Duc et al., Experimental Verification of 1 MHz PWM Inverter for Generating High Frequency Sinusoidal Current, 2016,IEEE, IPEMC-ECCE Asia, 1-5 (Year: 2016).*

(Continued)

*Primary Examiner* — Jue Zhang
(74) *Attorney, Agent, or Firm* — Lempia Summerfield Katz LLC

(57) ABSTRACT

A power Converter having power semiconductor components is disclosed herein, wherein a DC-link capacitor has a capacitance of less than 3 μF and is not designed as a separate electrical device of the power converter, and wherein the clock frequency is greater than 1 MHz. A vehicle, (e.g., an aircraft), including a power Converter of this kind is also described.

15 Claims, 4 Drawing Sheets

(56) References Cited

U.S. PATENT DOCUMENTS

| | | |
|---|---|---|
| 2016/0203915 A1 | 7/2016 | Nishiyama |
| 2019/0152617 A1* | 5/2019 | Anton .................. B64D 31/00 |

FOREIGN PATENT DOCUMENTS

| | | |
|---|---|---|
| DE | 102017126150 A1 | 5/2019 |
| EP | 2276162 A1 | 1/2011 |
| JP | 2013219919 A * | 10/2013 |

OTHER PUBLICATIONS

Chen, Tianyu, Sen Li, and Babak Fahimi. "Analysis of DC-link voltage ripple in voltage source inverters without electrolytic capacitor." In IECON 2018—44th Annual Conference of the IEEE Industrial Electronics Society, pp. 1041-1048. IEEE, 2018.

Duc, Luu Tien, and Keiji Wada. "Experimental verification of 1 MHz PWM inverter for generating high frequency sinusoidal current." 2016 IEEE 8th International Power Electronics and Motion Control Conference (IPEMC-ECCE Asia). IEEE, 2016. pp. 1-5.

EPC2112-200 V, 10 A Integrated Gate Driver eGaN® IC, Datasheet. Efficient Power Conversion Corporation. 2018. pp. 1-8.

GaN Systems. GS66516B—Bottom-side cooled 650 V E-mode GaN transistor. Datasheet. 2018. pp. 1-16.

German Office Action for German Application No. 10 2019 206 872.3 dated Mar. 27, 2020.

International Search Report and the Written Opinion for International Patent Application PCT/EP2020/062417 mailed Oct. 8, 2020.

Qian, Jinrong, and Gert Bruning. "2.65 MHz high efficiency soft-switching power amplifier system." 30th Annual IEEE Power Electronics Specialists Conference. Record.(Cat. No. 99CH36321). vol. 1. IEEE, 1999. pp. 370-375.

Transphorm Inc. TPH3205WSBQA—AEC-Q101 Qualified 650V Cascode GaN FET in TO-247 (source tab). Datasheet. 2017. pp. 1-10.

Winkelnkemper, Manfred. "Reduzierung von Zwischenkreiskapazitäten in Frequenzumrichtern für Niederspannungsantriebe." (2005). pp. 1-194 with abstract.

Written Opinion of the International Research Authority for International Patent Application No. PCT/EP2020/062417 mailed Oct. 8, 2020.

* cited by examiner

MINIMALISTIC POWER CONVERTER AND VEHICLE INCLUDING A POWER CONVERTER

The present patent document is a § 371 nationalization of PCT Application Serial No. PCT/EP2020/062417, filed May 5, 2020, designating the United States, which is hereby incorporated by reference, and this patent document also claims the benefit of German Patent Application No. 10 2019 206 872.3, filed May 13, 2019, which is also hereby incorporated by reference.

TECHNICAL FIELD

The disclosure relates to a power converter, (e.g., an inverter), including power semiconductor devices, and to a vehicle including a power converter.

BACKGROUND

In power converters, a DC-link capacitor, in its function as an electrical capacitance, serves the power converter as a buffer for the electrical energy needed per clock pulse to provide the motor current. The DC-link capacitor is a passive component which has a relatively high weight percentage (e.g., in a range of 10% to 20% of the total weight for standalone inverters; more than 25% for inverters integrated in the motor). Therefore, along with the power converter housing, the optional EMC filter, and the busbars (e.g., supply lines), which are mostly made of copper, rank among those individual parts that are by far the heaviest. Therefore, the DC-link capacitor may be the main point of attack when it comes to minimizing the weight of a power converter for a given power.

In addition to the available geometry, there are two main design criteria for the DC-link capacitor: first, the maximum voltage ripple during switching; and second, the maximum capacitor core temperature, which is produced largely (but not exclusively) by the capacitor ripple current.

Given a motor current to be provided and a given DC-link voltage, a specified voltage ripple leads to a necessary electrical capacitance, which, via the capacitor winding needed to achieve this, determines the overall size and hence also the weight. A possible countermeasure is to increase the clock frequency of the inverter (e.g., from 10 kHz to 20 kHz or 40 kHz), because this is indirectly proportional to the voltage ripple.

The problem with this is that the DC-link capacitor internal resistance ("ESR") rises in direct proportion to a reduced capacitance and hence the desired weight loss, and thus the losses increase and consequently so does the capacitor core temperature, assuming unchanged cooling. Because the cooling surface, (which decreases because of the reduction in size), decreases at the same time as losses are higher, limits are set to using a further increase in the clock frequency to reduce the capacitance, and consequently the installation space and weight.

Active cooling of the capacitor busbars or a different form factor that enlarges the surface are possible approaches to bringing the capacitance core temperature of the DC-link capacitors under control, nonetheless.

SUMMARY

The object of the disclosure is to provide a solution for reducing the weight of a power converter, in particular for aircraft.

The scope of the present disclosure is defined solely by the appended claims and is not affected to any degree by the statements within this summary. The present embodiments may obviate one or more of the drawbacks or limitations in the related art.

A first aspect of the disclosure includes not fitting a DC-link capacitor as a separate component of the power converter (e.g., no wound films, or the like, to which contact is made and which are connected to a busbar).

In a further aspect of the disclosure, the clock frequency of the power converter is increased by a factor in a range of 100 to 250, e.g., from 10 kHz to 40 kHz to 1 MHz.

The capacitance of the DC-link capacitor may thus decrease compared with the prior art by the same factor, from, for example, 250 µF at a clock frequency of 10 kHz to 1 µF to 2.5 µF. An imaginary area of a hypothetical plate capacitor of 30 cm×25 cm, for a relative dielectric constant of 3 (e.g., for Kapton plastic-film) and a film thickness of 30 µm, results in a capacitance of about 0.67 µF, which is not far from the target value of 1 to 2.5 µF to be achieved according to the estimation.

In a further aspect, the supply line from the source (e.g., HV battery) is widened at the power converter, shortly before the power semiconductors, and converted in a planar manner into a plate-capacitor form, at the far end of which the power semiconductors are connected directly. The plates are merely pressed together with a polypropylene film (such as used in DC-link capacitors in wound form).

The flat plate capacitor may be optimally cooled and may include very thin, (and wide), copper or aluminium, whose inductance is considerably lower than known conventional DC-link constructions, which require contact to be made into a housed capacitor winding.

Fast-switching semiconductors are needed for these switching frequencies. Gallium Nitride (GaN) power semiconductors are suitable. The switching frequency lies slightly above the frequency used today in hard-switching DC/DC controllers.

In a further aspect of the disclosure, a power converter is provided that has a minimalist design and does not use a ceramic or other conventional component. The minimalist output stage without a ceramic includes 13 components from the following component list: six GaN power semiconductor chips having monolithically integrated driver and protection functions and having galvanically isolated communication, one positive busbar, one negative busbar, one plastic-film, three AC terminals, (each in the form of a patterned leadframe), and one heatsink. If the clock signals are not calculated by the drivers themselves, it is possible to dispense with measuring a voltage and current in the output stage (although this is retained in another location).

The solution according to the disclosure involves an extremely low DC-link capacitance of less than 3 µF and requires extremely fast-switching semiconductors (e.g., switching at 1 MHz or more). The semiconductors are sintered directly onto the associated plate of the DC-link plate capacitor, where (e.g., for a 2-level inverter), the chip is sintered to DC+ by the other end (namely the drain) than the end on DC− (namely the source). Vertically constructed GaN transistors may be used.

In certain embodiments, a power converter includes power semiconductor devices, wherein the DC-link capacitor has a capacitance of less than 3 µF and is not in the form of a separate electrical device, and wherein the clock frequency is greater than 1 MHz.

In an embodiment, the power converter may include a first and a second supply line, which may be connected to a DC current source, and which are implemented immediately before the power semiconductor devices in a widened and planar form in such a way that a plate capacitor may be formed as the DC-link capacitor.

In a further embodiment, a plastic-film may be arranged between the supply lines as the dielectric of the plate capacitor.

In a further embodiment, the power converter may be an inverter. A power converter which uses an AC voltage or DC voltage to produce an AC voltage of a different frequency and amplitude is referred to as an inverter. Inverters may be configured as AC/DC-DC/AC inverters or DC/AC inverters, wherein an AC output voltage is generated from an AC input voltage or a DC input voltage via a DC link and switched semiconductors.

In an embodiment, the power converter includes the first and second supply lines, the plastic-film, six power semiconductor devices in GaN technology having monolithically integrated driver circuits and protection functions and having galvanically isolated communication interfaces, three AC terminals, and a heatsink.

The AC terminals may each be in the form of a patterned leadframe (e.g., a connection frame).

If the clock signals are not calculated by the drivers themselves, it is possible to dispense with measuring a voltage and current in the output stage. This is retained in another location, however.

In a further development, the first and second supply lines may have a planar design, and three power semiconductor devices may be arranged on the top face of the first supply line and of the second supply line, respectively. Each pair of power semiconductor devices is responsible for one commutation cell.

In a further embodiment, the first and second supply lines may have an L-shaped design, and three power semiconductor devices may be arranged on the top face of the shorter leg of the first supply line and of the second supply line respectively.

In a further aspect, the power converter is used in a vehicle, in particular, in an aircraft.

In another embodiment, a vehicle, (e.g., an aircraft such as an airplane), is provided. The vehicle includes a power converter as described herein for an electric or hybrid-electric drive.

A vehicle is understood to refer to any type of locomotion or transport device or apparatus, whether manned or unmanned. An aircraft is a flying vehicle.

In an embodiment, the vehicle has an electric motor supplied with electrical energy by the power converter, and a propeller that may be set in rotation by the electric motor.

Further special features and advantages of the disclosure become clear from the following explanations of an exemplary embodiment with reference to schematic drawings.

DETAILED DESCRIPTION

Figure 1:
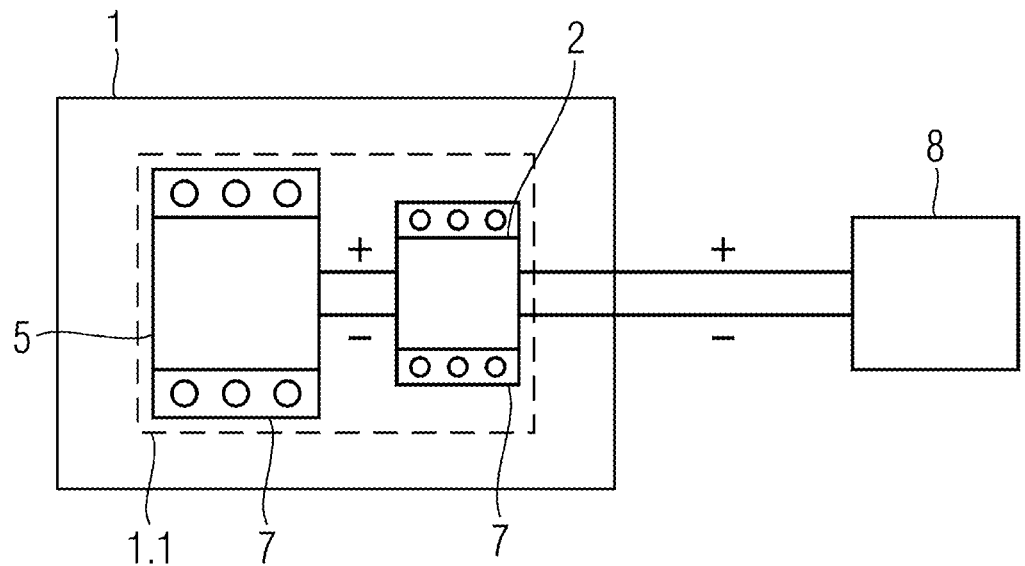
FIG. 1 is a block diagram of a power converter according to the prior art.

FIG. 1 shows a block diagram of a power converter 1 according to the prior art. The commutation cell 1.1 of one phase may be seen. A DC-link capacitor 2 is connected on the input side to a battery 8 or another DC voltage source. The DC-link capacitor 2 is connected on the output side to the power module 5, which contains the switchable power semiconductor devices 5.1 (not shown). A heatsink 7 removes heat from both the DC-link capacitor 2 and the power module 5. For higher levels of power dissipation, the heatsinks 7 are liquid cooled.

Figure 2:
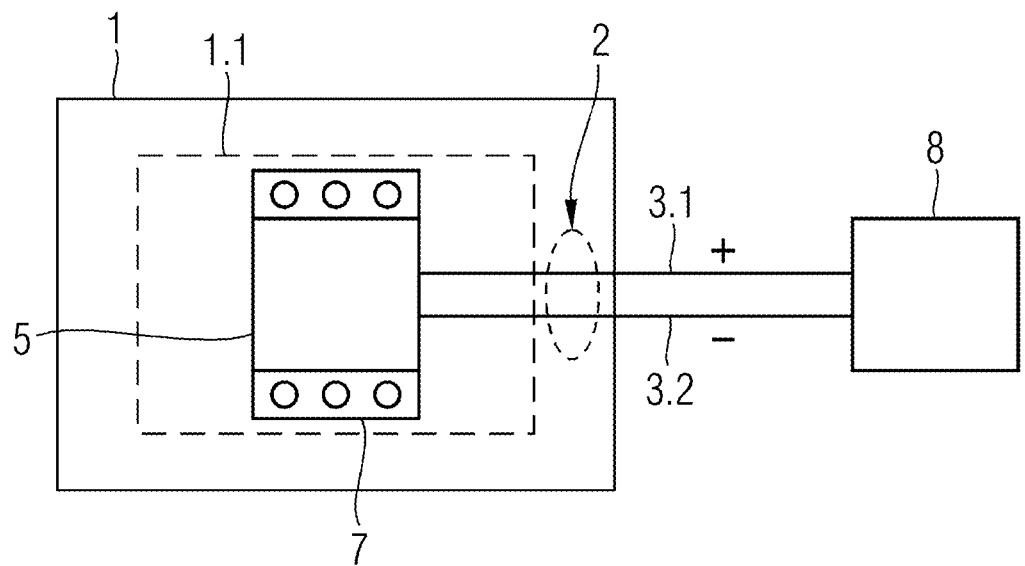
FIG. 2 is a block diagram of an example of a power converter without a DC-link capacitor.

FIG. 2 shows a block diagram of a power converter 1 without a DC-link capacitor 2 as a standalone, separate device. The commutation cell 1.1 of one phase may be seen. There is no standalone DC-link capacitor 2 present. The power module 5 is connected directly to a battery 8 or another DC current source via the first supply line 3.1 (DC+) and the second supply line 3.2 (DC−). The power module 5 contains the switchable power semiconductor devices 5.1 (not shown). The first and second supply lines 3.1, 3.2 form a DC-link capacitor 2 in the form of a plate capacitor. A heatsink 7 removes heat from the power module 5 and the plate capacitor. For higher levels of power dissipation, the heatsink 7 is liquid cooled.

The DC-link capacitor 2 has a capacitance of 2 μF. The power module 5 switches at a clock frequency of 1 MHz.

Figure 3:
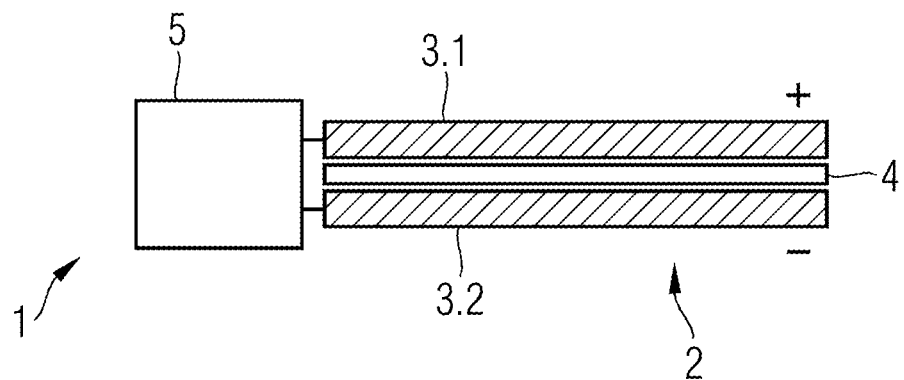
FIG. 3 is a side view of an example of first and second supply lines of a power converter.

FIG. 3 shows a side view of the power converter 1 according to FIG. 2. The first and second supply lines 3.1, 3.2 are in part in the form of a plate capacitor, thereby forming the DC-link capacitor 2. The first and second supply lines 3.1, 3.2 are electrically connected to the power module 5. A plastic-film 4 having a high electric dielectric strength and for the purpose of increasing the capacitance of the DC-link capacitor 2 lies between the supply lines 3.1, 3.2, which are arranged parallel to one another.

Figure 4:
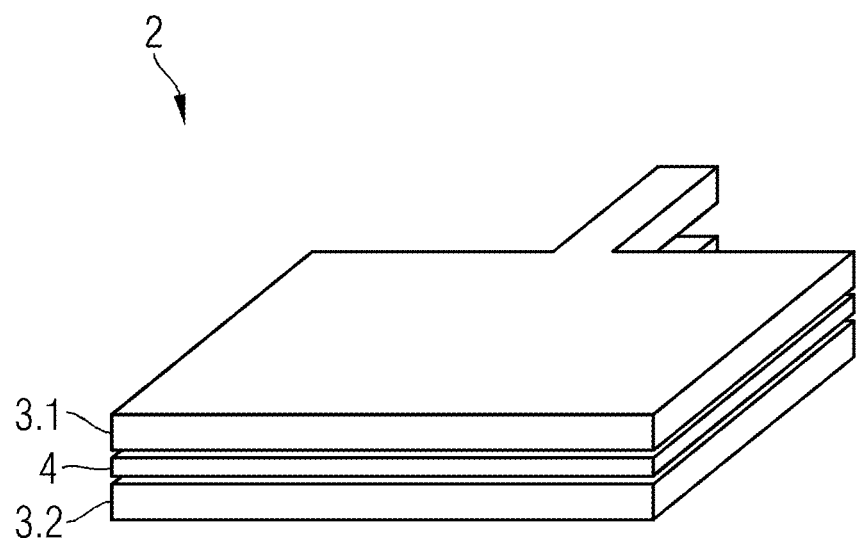
FIG. 4 is an oblique view of an example of first and second supply lines of a power converter.

FIG. 4 shows an oblique view of the first and second supply lines 3.1, 3.2 of the power converter 1 according to FIG. 3. The first and second supply lines 3.1, 3.2 are broadened in part in order to form a sufficiently large area for the plate capacitor.

Figure 5:
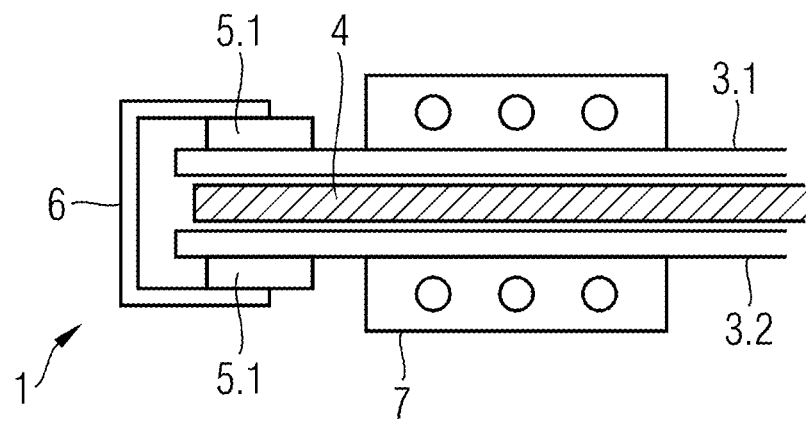
FIG. 5 is a side view of a first embodiment of a minimalist power converter.

FIG. 5 shows a side view of a first embodiment of a minimalistic power converter 1 according to FIG. 2 to FIG. 4. On the first and second copper supply lines 3.1, 3.2 are sintered six power semiconductor devices 5.1, three on each supply line 3.1, 3.2 (also called a "busbar"). Only two may be seen. A polypropylene plastic-film 4 lies between the supply lines 3.1, 3.2.

On the plate-shaped supply lines 3.1, 3.2 sits a heatsink 7 in a sandwich construction. The generated AC current may be fed to a load via the three AC terminals 6. Only one may be seen. The power semiconductor devices 5.1 may be configured in GaN technology. The power semiconductor devices 5.1 in particular are field effect transistors.

Figure 6:
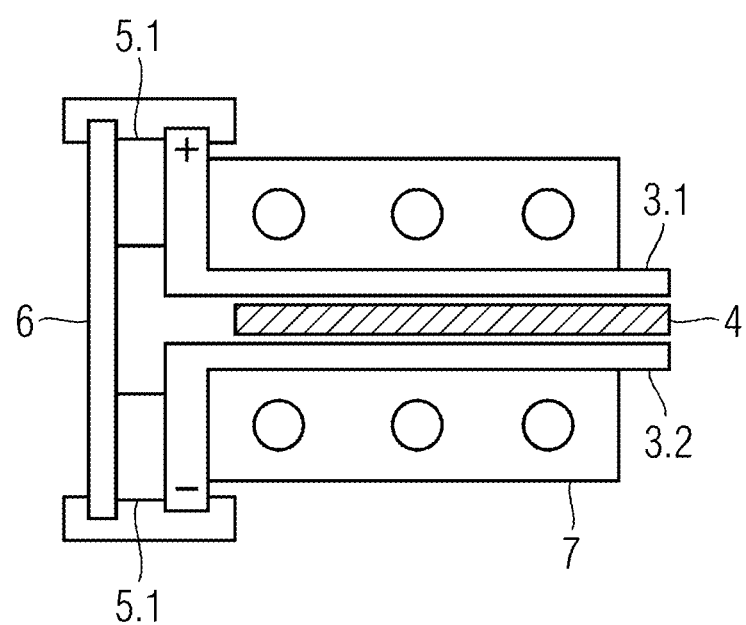
FIG. 6 is a side view of a second embodiment of a minimalist power converter.

FIG. 6 shows a side view of a second embodiment of a minimalist power converter 1 according to FIG. 2 to FIG. 4. The first and second supply lines 3.1, 3.2 are L-shaped, each having a long leg and a short leg. On the short legs of the first and second copper supply lines 3.1, 3.2 are sintered six power semiconductor devices 5.1, three on each supply line 3.1, 3.2. Only two may be seen. A polypropylene plastic-film 4 lies between the supply lines 3.1, 3.2.

On the long legs of the plate-shaped supply lines 3.1, 3.2 sits a heatsink 7 in a sandwich construction. The generated AC current may be fed to a load via the three AC terminals 6. Only one may be seen. The power semiconductor devices 5.1 may be configured in GaN technology. The power semiconductor devices 5.1 may be MOSFETs, IGBTs, or IGCTs.

The DC-link capacitor 2 may be considered to be a direct supply line 3.1, 3.2 from the energy source, which supply line has a modified form factor. A plate capacitor may be realized. If the capacitance needs to be increased, a small number of parallel-connected windings may be mounted geometrically one above the other. If a winding number of 1, (an ideal plate capacitor), is selected, then the DC-link capacitor in the form of an explicit component disappears from the extremely fast-switching inverter, because is it then a "parasitic" element of the widened first and second supply lines 3.1, 3.2. The DC-link inductance falls to a minimum.

Figure 7:
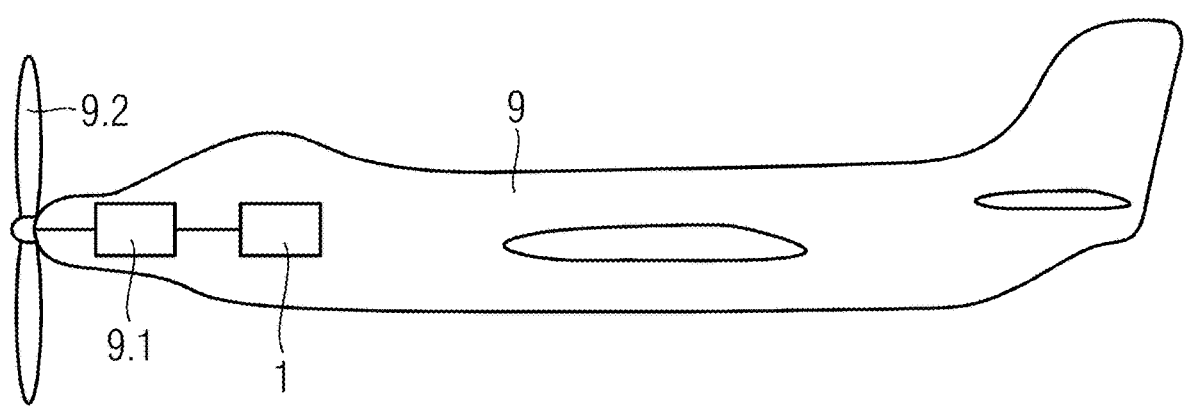
FIG. 7 shows an example of an aircraft including an electric thrust generating unit.

FIG. 7 shows an electric or hybrid-electric airplane 9 as an example of an aircraft, including a power converter 1 according to FIG. 2 to FIG. 6, which supplies an electric motor 9.1 with electrical energy. The electric motor 9.1 drives a propeller 9.2. Both are part of an electrical thrust generating unit. The power converter 1 may also be used for other applications, for instance an on-board electrical system or a battery supply.

Although the disclosure has been described and illustrated more specifically in detail by the exemplary embodiments, the disclosure is not restricted by the disclosed examples and other variations may be derived therefrom by a person skilled in the art without departing from the scope of protection of the disclosure.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

LIST OF REFERENCE SIGNS

1 Power converter
1.1 Commutation cell
2 Intermediate circuit capacitor
3.1 First supply line
3.2 Second supply line
4 Plastic-film
5 Power module
5.1 Power semiconductor device
6 AC terminal
7 Heatsink
8 Battery
9 Airplane
9.1 Electric motor
9.2 Propeller

The invention claimed is:

1. A power converter comprising:
power semiconductor devices;
a first supply line; and
a second supply line,
wherein the first supply line and the second supply line are implemented before the power semiconductor devices in a widened and planar form to provide a plate capacitor,
wherein the power semiconductor devices are configured to be connected to a battery or another direct current (DC) source via the first supply line and the second supply line,
wherein the plate capacitor is configured to function as a DC-link capacitor such that the power converter does not comprise a standalone, separate DC-link capacitor,
wherein the plate capacitor has a capacitance of less than 3 µF, and
wherein a clock frequency for switching the power semiconductor devices is greater than 1 MHz.

2. The power converter of claim 1, further comprising:
a plastic-film as a dielectric of the plate capacitor.

3. The power converter of claim 2, wherein the power converter is an inverter.

4. The power converter of claim 3, further comprising:
three AC terminals; and
a heat sink,
wherein the power semiconductor devices comprise six power semiconductor devices in Gallium Nitride (GaN) technology having monolithically integrated driver circuits and protection functions and having galvanically isolated communication interfaces.

5. The power converter of claim 4, wherein the first and second supply lines each have a planar design, and
wherein three power semiconductor devices of the six power semiconductor devices are arranged on a top face of the first supply line and a top face of the second supply line.

6. The power converter of claim 4, wherein the first and second supply lines each have an L-shaped design, and
wherein three power semiconductor devices of the six power semiconductor devices are arranged on a top face of a shorter leg of the first supply line and a top face of a shorter leg of the second supply line.

7. A vehicle comprising:
a power converter for an electric or hybrid electric drive,
wherein the power converter comprises:
power semiconductor devices;
a first supply line; and
a second supply line,
wherein the first supply line and the second supply line are implemented before the power semiconductor devices in a widened and planar form to provide a plate capacitor,
wherein the power semiconductor devices are configured to be connected to a battery or another direct current (DC) source via the first supply line and the second supply line,
wherein the plate capacitor has a capacitance of less than 3 µF, and
wherein a clock frequency for switching the power semiconductor devices is greater than 1 MHz.

8. The vehicle of claim 7, wherein the vehicle is an aircraft.

9. The vehicle of claim 8, wherein the aircraft is an airplane.

10. The vehicle of claim 9, further comprising:
an electric motor configured to be supplied with electrical energy by the power converter, and
a propeller configured to be set in rotation by the electric motor.

11. The vehicle of claim 7, wherein the power converter further comprises a plastic-film as a dielectric of the plate capacitor.

12. The vehicle of claim 11, wherein the power converter is an inverter.

13. The vehicle of claim 12, wherein the power converter further comprises three AC terminals and a heat sink, and
wherein the power semiconductor devices comprise six power semiconductor devices in Gallium Nitride (GaN) technology having monolithically integrated driver circuits and protection functions and having galvanically isolated communication interfaces.

14. The vehicle of claim 13, wherein the first and second supply lines each have a planar design, and
wherein three power semiconductor devices of the six power semiconductor devices are arranged on a top face of the first supply line and a top face of the second supply line.

15. The vehicle of claim 13, wherein the first and second supply lines each have an L-shaped design, and
wherein three power semiconductor devices of the six power semiconductor devices are arranged on a top face of a shorter leg of the first supply line and a top face of a shorter leg of the second supply line.

* * * * *